United States Patent [19]

Hurley et al.

[11] Patent Number: 5,539,608
[45] Date of Patent: Jul. 23, 1996

[54] ELECTRONIC INTERLOCK FOR ELECTROMAGNETIC CONTACTOR

[75] Inventors: Rick A. Hurley, Fletcher; Mark E. Innes, Asheville; Parker A. Bollinger, Jr., Fletcher, all of N.C.

[73] Assignee: Eaton Corporation, Cleveland, Ohio

[21] Appl. No.: 23,012

[22] Filed: Feb. 25, 1993

[51] Int. Cl.⁶ .................................................. H01H 47/04
[52] U.S. Cl. ................................................ 361/152; 361/154
[58] Field of Search ...................................... 361/152–156

[56] References Cited

U.S. PATENT DOCUMENTS

| | | | |
|---|---|---|---|
| 4,819,118 | 4/1989 | Mueller et al. | 361/25 |
| 4,823,825 | 4/1989 | Buchl | 137/1 |
| 4,893,102 | 1/1990 | Bauer | 335/132 |
| 4,970,622 | 11/1990 | Büchl | 361/154 |
| 5,053,911 | 10/1991 | Kopec et al. | 361/154 |
| 5,128,825 | 7/1992 | Hurley et al. | 361/154 |
| 5,146,388 | 9/1992 | Parker et al. | 361/153 |
| 5,153,522 | 10/1992 | Sano | 324/546 |
| 5,196,983 | 3/1993 | Stumpf | 361/154 |
| 5,256,973 | 10/1993 | Thee et al. | 324/418 |
| 5,293,551 | 3/1994 | Perkins et al. | 361/154 |

FOREIGN PATENT DOCUMENTS

| | | |
|---|---|---|
| 3326605A1 | 7/1983 | Germany . |
| 2205198 | 11/1988 | United Kingdom . |
| 2250350 | 6/1992 | United Kingdom . |

*Primary Examiner*—Fritz M. Fleming
*Attorney, Agent, or Firm*—Martin J. Moran

[57] ABSTRACT

An electrical contactor has first and second contacts movably mounted to engage for achieving continuity in an electrical circuit, via an electromagnet and armature defining a magnetic circuit with an air gap that closes in a first position of the contactor and opens in a second position of the contactor. A controller switches an alternating current voltage to the coil of the electromagnet during a timed portion of each AC half cycle, and senses the current level in the coil in a feedback loop. The controller adjusts the voltage-on time to achieve a predetermined average current as needed for accelerating the armature or coasting during a closing operation, for holding the armature in place when closed, etc. In order to sense whether the contactor is presently open or closed, the controller monitors and stores the phase angle between the previous voltage zero crossing and the time of voltage turn-on. When the inductance of the magnetic circuit including the electromagnet and armature changes rapidly due to opening or closing of the air gap between them, the controller detects a corresponding variation in the phase angle. The controller is preferably a microprocessor, programmed to normalize the phase angle over a range of coil drive voltages. The microprocessors of a number of such contactors can communicate in order to effect coordinated operations.

13 Claims, 3 Drawing Sheets

ELECTRONIC INTERLOCK FOR ELECTROMAGNETIC CONTACTOR

BACKGROUND OF THE INVENTION

1. Field of the Invention

This invention relates to the field of electrical contactors for motor starters and similar devices, and in particular to an electronic interlock that senses the open or closed condition of the contactor by monitoring the inductance of the contactor coil, the inductance changing as a function of the air gap between the armature and the magnet.

2. Prior Art

Electromagnetic contactors having one or more sets of contacts which are opened and closed by voltage applied to a coil are useful for various switching and control functions. A contactor usually has a magnetic circuit which includes a fixed magnet and a movable magnet or armature, with an air gap between them when the contactor is opened. An electromagnetic coil is controllable upon command to interact with a source of voltage which can be coupled across the main contacts of the contactor for electromagnetically accelerating the armature towards the fixed magnet, thus reducing the air gap.

The armature carries a set of bridging contacts, operable to electrically connect fixed contacts, mounted in the contactor case, as the magnetic circuit is energized and the armature is moved. The load and the voltage source are usually connected to the fixed contacts and become interconnected with one another as the bridging contacts make with the fixed contacts.

As the armature is accelerated towards the magnet, it is opposed by two spring forces. The first spring force is due to a kickout spring which is subsequently used to disengage the contacts by moving the armature in the opposite direction when the power applied to the coil has been removed. This occurs as the contacts are opened. The other spring force is due to a contact spring which begins to compress as the bridging contacts abut the fixed contacts, but while the armature is still moving towards the fixed magnet as the air gap is reduced to zero.

Unlike a simple circuit breaker, which opens contacts in overcurrent conditions and must be manually reset, a contactor may be arranged to open and close contacts in various ways, sometimes repeatedly, for example to start, stop, coast or reverse a motor. Contactors can be combined with various overload protection means, in which case the contactor is typically called a motor controller. Single phase and multiphase contactor switching arrangements can be used, and high current switching capability can be provided.

There are numerous possibilities for specific applications of contactors. With a bidirectional motor, for example, two contactors may be coupled to the motor circuit, one for establishing contacts for forward rotation and the other for reverse. Other possibilities include varying the connections to a motor for starting or stopping in sequential steps, connecting the motor as an autotransformer, switching between wye and delta connections, etc. In order to control or coordinate operation of one or more contactors coupled to a control apparatus, or to a manually operated switching means, it is often desirable to provide a signal which indicates the present status of the contactor, i.e., whether the contacts are open or closed. This signal can be used by the control circuits for switching between respective control states. It would be possible to use, the switched voltage to provide such a status indication. However, this is not desirable for a number of reasons. The voltage is very noisy due to the current variations caused by contact bounce and by the typically inductive nature of the load. The state of the contacts may need to be determined before a voltage is available at the contacts, e.g., before operating a switching means more proximally coupled to the power mains. On the other hand, coupling the contact voltage to an external sensing device requires additional parts. For all these reasons, it would be desirable to provide a different form of interlock.

Apart from signals which may be coupled to external control circuits to govern operation of a system including an electromagnetic contactor, internal control circuits for contactors are known and used for various purposes. U.S. Pat. No. 4,893,102—Bauer teaches a contactor apparatus including a microprocessor controller operable to vary the power applied to the contactor coil during a closing stroke, to accelerate the armature at high power during an initial phase of closing, then to coast and finally to maintain contact, at reduced power. This arrangement reduces mechanical shock, contact bounce and other adverse effects of accelerating the armature at equal power over the stroke. The power applied to the coil is varied by a timing technique wherein a triac is triggered at progressively later times during the alternating current half cycles so as to apply progressively less current to the coil.

An objective according to Bauer is to control the velocity of the armature by reducing the coil drive current to a hold level after applying only sufficient acceleration for the armature to complete the stroke. The velocity of the armature thus slows to zero just as the air gap reaches zero and the remaining coil drive current holds the contacts closed. However, it is difficult to set this relationship exactly, or once the relationship is set to assume that it will not change over time. It would be desirable in a controller according to Bauer to sense when the air gap has reached zero. This would save power by providing feedback to the controller as to the particular amount of acceleration which is needed to just overcome the kickout spring and the contact spring.

U.S. Pat. No. 4,819,118—Mueller et al also teaches a microprocessor controller for a contactor system. Two contactors each have their own controllers, and are arranged to apply power to a reversing motor for rotation in opposite directions. The two controllers are coupled in communication and either can cause both contactors to trip in the event of thermal overloading of the motor. Current supplied to the load from each of the two contactors is monitored using analog to digital converters. The respective controller's microprocessor samples the output of the analog to digital converter and develops an estimation of the heat accumulated by the motor in its reversing operation. In this manner the current applied through both contactors is used to determine heating in the load, rather than only the current applied through the contactor which happens to be active.

It is an object of the present invention to sense the open/closed status of- an electromagnetic contactor by monitoring for the change in inductance of the coil circuit which occurs as a function of the air gap, or lack of an air gap, between the armature and the coil of the magnetic circuit.

It is another object of the invention to apply the current and voltage level sensing apparatus of a microprocessor controlled electromagnetic contactors to collect sufficient information to detect the change in the inductance of the magnetic circuit.

It is a further object of the invention to improve the operation of a microprocessor controller which switches current to a contactor coil in timed partial half cycles by sensing the change in the phase angle of switching which occurs between the open and closed states of the contactor.

These and other objects are accomplished in an electrical contactor having first and second contacts movably mounted to engage for achieving continuity in an electrical circuit, via an electromagnet and armature defining a magnetic circuit with an air gap that is closed in a first position of the contactor, normally when the contacts are made, and open in a second position of the contactor. A controller switches an alternating current voltage to the coil of the electromagnet during a timed portion of each AC half cycle, and senses the current level in the coil in a feedback loop. The controller adjusts the voltage-on time to achieve a predetermined average current as needed for accelerating the armature or coasting during a closing operation, for holding the armature in place when closed, etc. In order to sense whether the contactor is presently open or closed, the controller monitors and stores the phase angle between the previous voltage zero crossing and the time of voltage turn-on. When the inductance of the magnetic circuit including the electromagnet and armature changes rapidly due to opening or closing of the air gap between them, the controller detects a corresponding variation in the phase angle. The controller is preferably a microprocessor, programmed to normalize the phase angle over a range of coil drive voltages. The microprocessors of a number of such contactors can communicate in order to effect coordinated operations.

The microprocessor can test the inductance of the magnetic circuit including the coil and armature during a known status of the contactor. For example, after initiating a closing operation by applying wide voltage pulses to the coil, the microprocessor can output a train of shorter test pulses, e.g., of sufficient width to hold the armature once the contacts are closed, monitoring and storing the phase angle of the time at which the voltage must be switched on to maintain a holding current level. As the air gap closes, the inductance and the phase angle change, whereupon the microprocessor outputs an appropriate signal indicating a closed status or otherwise branches in its control routine in view of the change in status.

Similarly, during an opening operation the microprocessor ceases switching voltage to the electromagnet for sufficient time to allow the kickout spring and contact spring to exert a force which will accelerate the armature open, then outputs a series of pulses, again maintaining a given current level in the electromagnet and monitoring for the change in voltage switching phase angle that indicates opening of the air gap and a drop in inductance of the magnetic circuit. The same operation can also detect sudden opening (i.e., opening due to mechanical shock or the like) during an ongoing close-and-hold operation.

The invention facilitates coordinated operation of a number of contactors, each having a local control microprocessor operable to detect the status of the local contactor unit, and each being coupled in data communication with one or more others. An example is a coordinated motor reversing operation in a contactor arrangement having a first contactor for operating the motor in a forward mode and a second contactor for reverse. The invention is readily applicable to a contactor of the type having a microprocessor or similar controller to vary the current level in the electromagnetic coil to effect soft-close operations in which the level of energy applied to pull in the armature is minimized to the amount needed to overcome the kickout spring and contact spring force.

BRIEF DESCRIPTION OF THE DRAWINGS

An understanding of these and other objects and aspects of the invention can be obtained from the following description of certain preferred embodiments when read in conjunction with the accompanying drawings, wherein.

DETAILED DESCRIPTION OF THE PREFERRED EMBODIMENTS

The invention comprises an all-electronic interlock that senses the closed or open position of a contactor using the change in inductance of the coil circuit. The interlock functionally replaces an external electrical interlock to provide feedback information as to whether the contactor is closed or open. However, additional hardware is not required because the change in coil circuit inductance is detected by a change in timing (i.e., phase angle) which occurs in the switching of a feedback-operated current controlling circuit.

The conditions addressed by the interlock include verification of closing, verification of opening, sudden opening and status verification for operation of sequential and reversing contactor controls, This information can be made available from the contactor to a contactor or motor starter control system encompassing a number of contactor units, for example over data communication links from or between the microprocessors of individual contactor controllers such as the microwire or IMPACC communication links which are available in some contactor control circuits. The status report thus can become a parameter which facilitates sequential starter control functions such as autotransformer, wye-delta and other switching functions.

Figure 1:
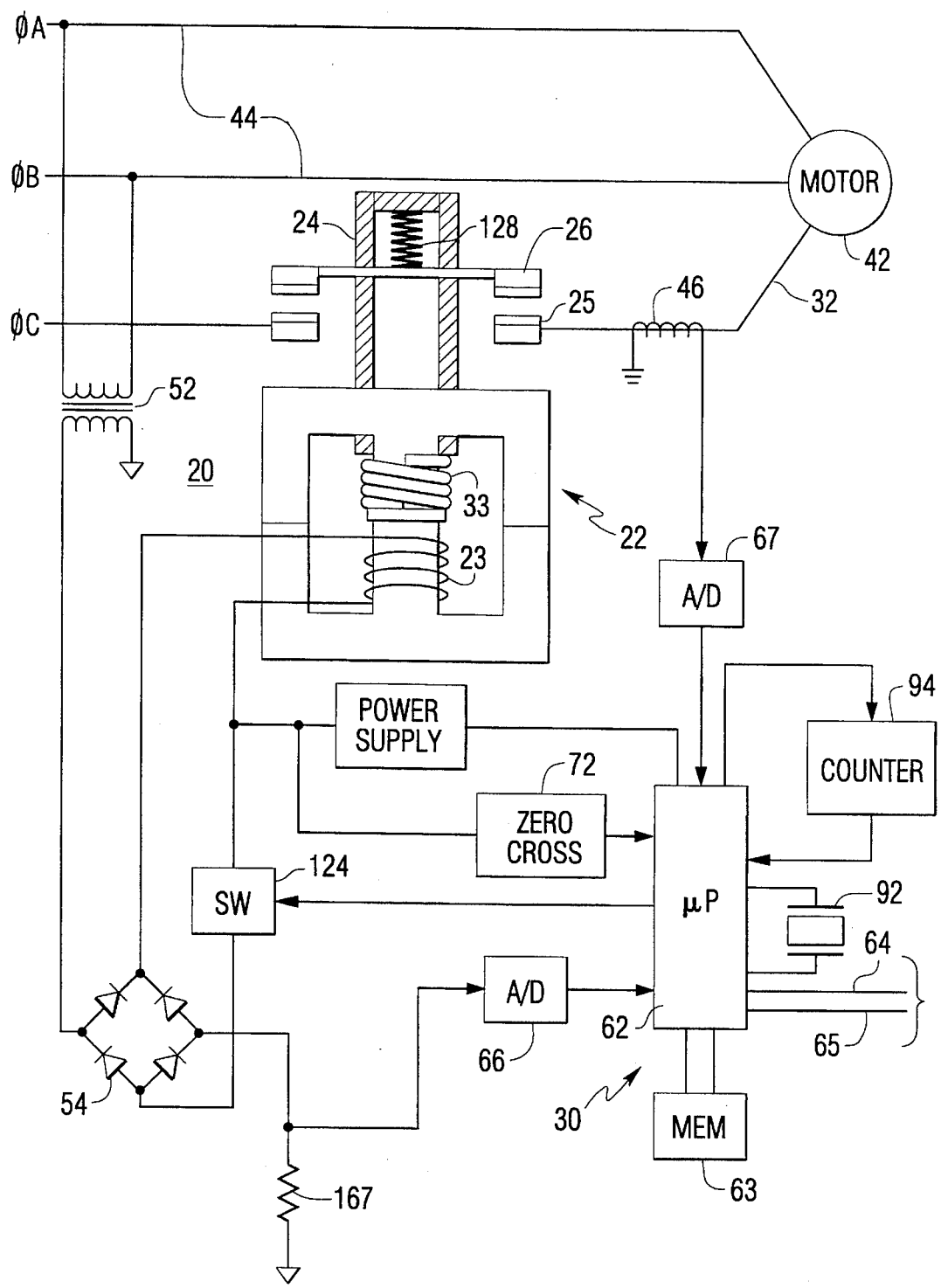
FIG. 1 is a functional block diagram showing an electrical contactor and control system according to the invention.
Figure 2:
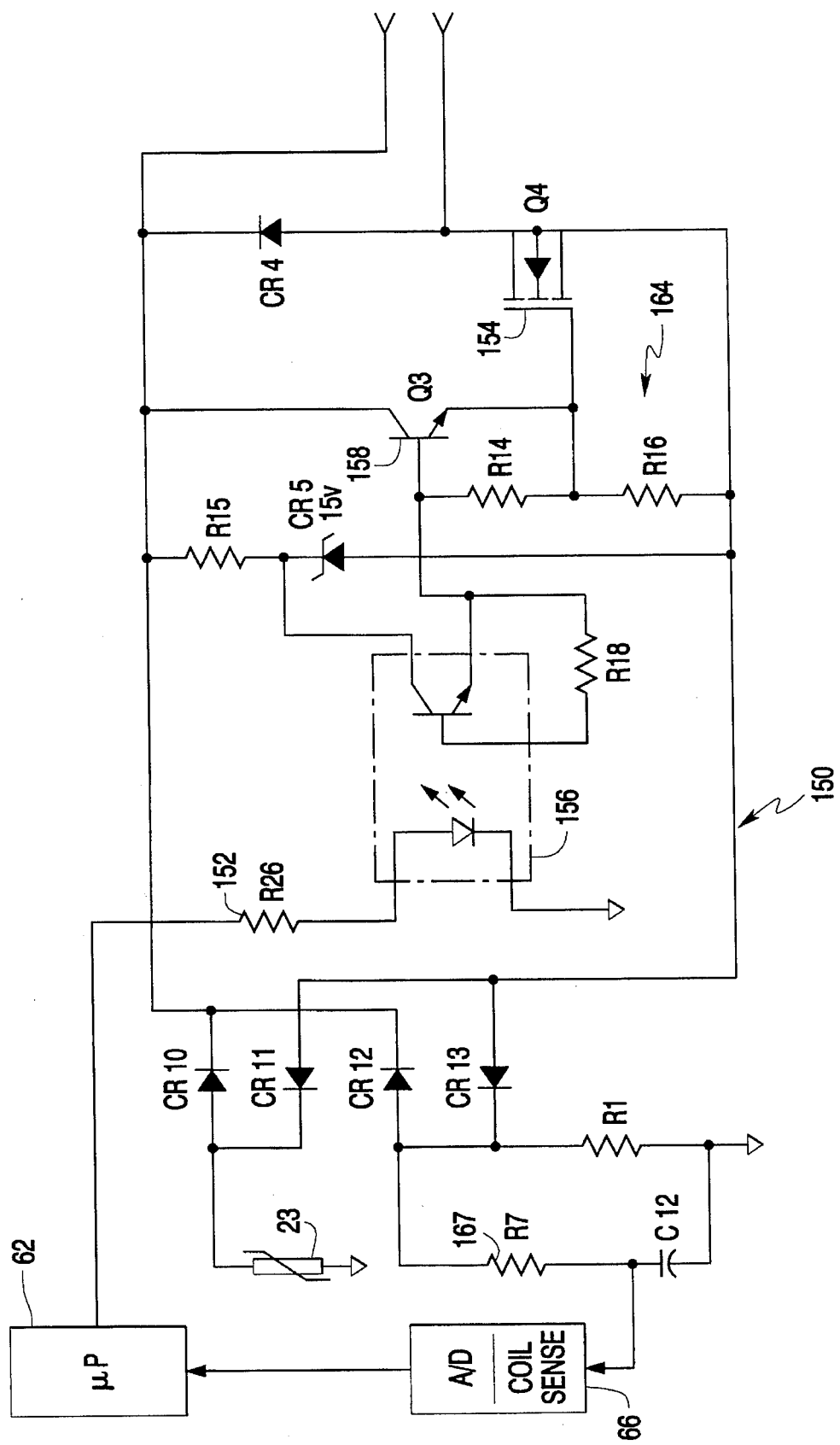
FIG. 2 is a schematic circuit diagram showing a coil driver circuit for energizing the contactor.

In FIG. 1, a modular electrical contactor control system is shown in block form, for example to be used to control application of power to a motor from a three-phase power line. FIG. 2 illustrates a preferred embodiment of the driver and coil current sensing circuits of the contactor control system. A forward contactor and a reverse contactor may be provided and coupled in data communications for coordinating operation. Only one phase and only one contactor are shown in the drawings.

The contactor 20 has an electromagnet 22 including a coil 23 operable when energized with a driving current to apply a magnetic force to an armature 24, which typically includes a permanent magnet. A first electrical contact 25 is fixed in the contactor casing, and a second electrical contact 26 is movable by displacement of the armature 24, into engagement with the fixed contact 25. A contactor controller 30 switches power to the coil 23 to effect making or breaking of continuity between contacts 25, 26, typically to switch AC power to a load circuit 32. A kickout spring 33 is provided to urge the armature 24 into an open position, i.e., to resist the magnetic force on the armature which is exerted by the coil 23 when energized. Accordingly, when current to coil 23 is switched off, the contacts 25, 26 disengage, and when current is switched on, the contacts engage. In addition to the kickout spring 33, at least one of the contacts 25, 26 is mounted resiliently on a contact spring intended to press the contacts together when the armature 24 is fully retracted toward the coil 23, and the air gap 34 in the magnetic circuit which includes the coil 23 and armature 24 is zero.

The contactor can switch AC power to a motor 42 from a power line 44, and can be operated in conjunction with additional circuitry to effect a sequence of contact making and breaking operations as needed for starting or stopping the motor 42, coasting, reversing, etc. Load current sensing current transformer 46 can be coupled along the conductor 32 leading to the load, for effecting an overload protection function via analog to digital converter 67, coupled to processor 62 of controller 30, as shown in FIG. 1.

Power for operating the contactor 20 and the controller 30 can be separate from the switched power line or obtained from two of the phases of the power line 44 on the source side of the contactor. A DC power source is needed to operate the coil 23 and the controller 30, and a transformer 52, rectifier 54 are provided to obtain DC power. The controller 30 for the contactor preferably comprises a microprocessor 62, for example as disclosed in U.S. Pat. Nos. 4,893,102—Bauer and/or 4,819,118—Mueller et al, which are hereby incorporated. In addition to simple logical functions, the microprocessor 62 and the memory 63 enable more complex control of the contactor, such as time averaging of current loading, indirect estimation of temperature conditions, communication over external data inputs and outputs 64, 65 between plural contactors operating in conjunction, and other functions.

Current, voltage and timing information are provided to the microprocessor 62. An analog to digital converter 66 is coupled to a coil current sensing resistor 167 for sampling instantaneous coil current level. A voltage zero crossing detector 72 provides a pulse to the microprocessor 62 at voltage zero crossings 80 on the AC power supply to the coil driving circuit (See FIG. 3), for timing reference to the beginning of an AC cycle or half cycle. Pulses from a clock oscillator 92 providing the microprocessor clock signal can be applied to a counter 94 having outputs coupled to the microprocessor 62 for obtaining elapsed time information, or the microprocessor can determine timing information by a programmed function such as by counting the number of cycles through a programmed status checking loop.

In a conventional mode of operation, the microprocessor 62 adjusts the time during each voltage half cycle that the contactor coil 23 is energized, to thereby control the contactor coil current as needed for the particular operation. When initiating a closing operation, the microprocessor 62 triggers the application of current to the coil 23 relatively earlier in each voltage cycle, for example using a triac or similar switching element 124. The earlier application of current during the successive cycles is such that a relatively larger proportion of the total energy which would be available from each full half cycle is applied to accelerate the armature 24 toward the closed position as the current is integrated over the remainder of each half cycle. The armature 23 is accelerated sufficiently early in the closing operation to bring the armature to a predetermined velocity that will be sufficient to overcome the resistance of the kickout spring 33 and the contact spring 128 when the armature 23 engages these springs later in the closing operation.

While switching the voltage to the coil 23 over a portion of each half cycle, the microprocessor 62 repetitively reads the current level in the coil a coil current sensing resistor 167, coupled to analog to digital converter 66. Preferably, the coil current is read at one predetermined point during each half cycle, however it would also be possible to sample the current at a plurality of points. The microprocessor increases or decreases the delay between a zero crossing 80 and the switch-on point 140, to increase or decrease the level of current in coil 23 in a feedback control loop. The particular levels of current which are needed for the respective operations can be stored in memory 63, or calculated based on other sensed parameters.

After accelerating the armature 23 to the required velocity during a closing operation, the current level is reduced by switching the current to the coil on at a later point in each half cycle. During this intermediate part of the closing operation the coil 23 substantially maintains the velocity of the armature (i.e., the armature coasts). Although it would be possible to reduce coil current to zero, according to the invention the current is reduced only to a test level which enables the microprocessor 62 to record the phase angle of the voltage switch-on point, for later comparison.

As the contactor closes, the microprocessor switches only sufficient current to hold the contactor closed. The energy applied is a function of coil current, being controlled by operation of the microprocessor to maintain this sufficient holding energy. Inasmuch as the closing of the contacts reduces the air gap between the armature and the coil magnet to zero, the inductance of the coil circuit increases upon closing, and more electromagnetic energy is stored in the coil circuit. As a result, a shorter on-time will maintain the same current level at the time the current is sampled.

The amount of energy required for holding the armature against the force of the springs 33, 128 does not change. The energy applied is a function of current and the coil circuit inductance. When the inductance increases due to closure of the air gap, the microprocessor (which is still maintaining the predetermined current level) responds by moving the switch-on point to a later time, or greater phase angle, in the voltage half cycle.

Figure 3:
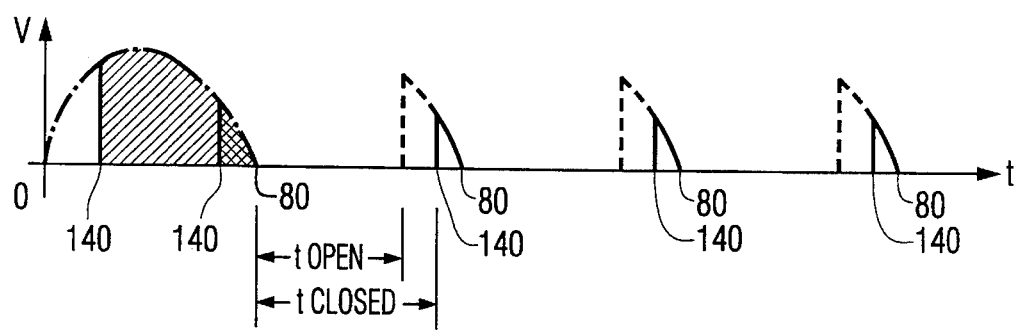
FIG. 3 is a graph of contactor coil voltage vs. time, showing the change in voltage conditions between contactor-closed (solid line) and contactor-open (broken line) conditions under control of the microprocessor controller.
Figure 4:
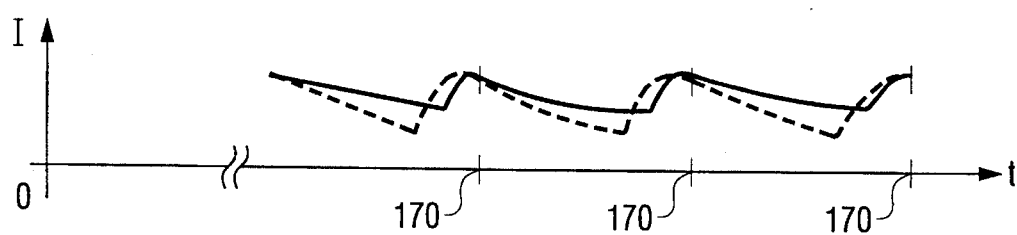
FIG. 4 is a graph of contactor coil current, corresponding to FIG. 3.

This operation is shown graphically in FIGS. 3 and 4, which compare the timing of current switching when the contactor 20 is closed (solid lines) and open (broken lines). The microprocessor or other control circuit is arranged to monitor for the change in phase angle upon switching, and to output a signal representing the closed status of the contactor when the phase angle of the current switching (i.e., delay from previous voltage zero crossing) increases.

The change in inductance can also be used for verification of opening. During standard opening functions (i.e., controlled opening) as well as fast opening and closing (inadvertent or uncontrolled), the change in inductance identifies opening of the air gap and imminent or completed loss of electrical continuity between contacts 25, 26.

During controlled opening, the holding current is removed from the coil 23. A short interval elapses after the holding current until the air gap 34 opens due to the action of the contact spring 128 and kickout spring 33 lifting the armature 24 from the coil magnet and breaking the contacts 25, 26. The microprocessor 62 can determine the point at which the contactor opens by maintaining a minimal test current in the coil, and monitoring for the change in phase angle (now a reduction in the delay from zero crossing) which occurs when the air gap 34 opens and the coil circuit inductance drops.

Fast opening is detected by a change of phase angle which occurs while the microprocessor 62 continues to apply holding current to the coil. The holding current level is normally only sufficient to hold the armature when the air gap is zero, and it is desirable to apply only as much energy as necessary. In the event of a mechanical shock or the like which jars the armature 24 and opens the air gap 34, the holding current may not be sufficient to recover the closed position of the contactor. However, according to the invention the microprocessor 62 can readily detect fast opening and increase the coil driving current to re-seat the armature, or otherwise react to the condition (e.g., by signalling a larger control system or another contactor).

The particular inductance and the magnitude of inductance change due to opening/closing of the air gap will depend on the particular structure of the contactor coil circuit. By way of example, the Westinghouse Electric Corporation Model F34 contactor has a magnet/armature open inductance of 50 mH and a magnet/armature closed inductance of 80 mH. It will be apparent that this change in inductance produces a readily discernable difference in switching phase angle when controlling for a predetermined coil current level in the feedback control. The phase angle thus can be used to determine the position of the armature in a dependable manner.

FIG. 2 shows a contactor coil driver circuit 150, of the type used to control Westinghouse contactor-99 devices. The microprocessor 62 (U1) outputs a high level via resistor 152 (R26) that turns on FET switching transistor 154 (Q4) via a switching circuit including an optical isolator 156 (U2), which is biased by resistor R15 and zener diode CR5. The output of the optical isolator 154 is coupled to the FET switch through NPN switching transistor 158 (Q3). The emitter of transistor 158 is coupled to the gate input of FET 154, and biased by resistors 164 (R14, R16, R18). In this manner current is switched on to flow through the contactor coil 23 via diodes CR10–CR13. The circuit forms a full wave rectifier wherein the voltage is switched on at the time of the signal from microprocessor 62.

The coil current level is sampled and fed back to the microprocessor 62 via resistor 167 (R7). To obtain coil current regulation, the microprocessor 62 samples the coil current, as represented by the voltage on resistor 167, via the A to D converter 66 as in FIG. 1. The microprocessor samples the current level at the same phase angle or time 170 in each half cycle relative to the previous voltage zero crossing 80, in a "point on wave" current sampling method. As shown in FIGS. 3 and 4, the point 170 of sampling can correspond to a zero crossing 80 in the voltage supply. The exact shape and magnitude of the coil current before and after the instantaneous point of measurement need not be sampled by the microprocessor, however the shape and magnitude are affected by inductance and it is conceivable to sample the current at various phase angles and to use the shape of the current wave as an indicator of the change in inductance occurring upon opening or closure of the air gap 34.

FIG. 3 shows switched voltage over time. The leftmost half cycle shows the available supply voltage in dot-dash lines. When accelerating the armature, the microprocessor switches on the voltage early in the half cycle, e.g., before the voltage peak. The voltage remains on until the next zero crossing 80, as represented by hatching under the waveform. For holding the armature, or to test the inductance of the magnetic circuit, the microprocessor turns the voltage on nearer to the zero crossing 80, as shown by additional (cross) hatching. The remainder of FIG. 3, as well as FIG. 4, demonstrate the effect of the change in inductance of the magnetic circuit between the contactor-closed situation (solid lines) and the contactor-open situation (broken lines) as the microprocessor controls the coil current by regulating the turn-on point to maintain a constant current level at time 170, when the current is sampled.

When the contactor is open the microprocessor 62 must maintain a longer voltage on-time in order to maintain a given current at the time of instantaneous measurement, than when the contactor is closed. The increased on-time is needed because with less inductance in the open condition, less energy is stored in the coil circuit. The microprocessor increases the on-time by using a shorter timed delay $t_{open}$ than the delay $t_{closed}$ when the contactor is closed.

Closing verification is performed by periodically applying holding pulses when the contactor is open, which can be, for example, a tenth of the required closing current, in order to test the phase angle delay of the coil circuit when open. The phase angle delay can be represented by counting clock pulses from the previous zero crossing 80, using a binary counter 94 as shown in FIG. 1, or via a programmed operation of the microprocessor, e.g., responsive to an interrupt. The result of at least one such measurement of the open condition phase angle at holding current conditions is stored, or preferably the results of a number of measurements are averaged.

When a closing operation is commenced, the armature 24 is accelerated for a period as discussed above. Then holding level currents are again applied to the coil 23, and the phase angle delay is compared to the data obtained when the contactor 20 was open. The phase angle differs substantially from the stored data when the contactor closes, providing an indication that closing has been completed.

The phase angle delay maintained by the microprocessor 62 must differ as a function of voltage as well, since the object is to maintain the predetermined level of current. Should a voltage shift occur in the AC voltage applied to the coil driving circuit, e.g., due to loading by a motor coupled through the contactor to the same AC mains, the phase angle delay can be related to the voltage as sensed by the microprocessor 62, using a linear approximation. As shown by exemplary binary (hexadecimal) counts in TABLE I, the difference in phase angle delay between the open and closed contactor conditions are readily apparent.

TABLE I

| Phase Angle Delays: Closing Verification | | |
|---|---|---|
| VOLTAGE | CLOSED | OPEN |
| 130 | 251 | 219 |
| 120 | 248 | 1F2 |
| 110 | 226 | 1E9 |
| 100 | 211 | 1C2 |
| 90 | 1EC | 198 |
| 80 | 1C0 | 16F |
| 75 | 1A2 | 150 |

A similar operation can be used for opening verification. The voltage and phase angle delay are recorded while the contactor is closed and the holding current is applied (i.e., before commencing an opening operation). Upon commencing opening, the coil current is switched off entirely, and the microprocessor can sample the coil current to ensure that it is zero before proceeding. Alternatively, the coil driving current can be reduced to a level insufficient to overcome the spring pressure. As the pressure of the contactor spring and kickout spring come into play, a series of test pulses are again applied, e.g., at the holding level, and the voltage and phase angle are compared to the data recorded while holding (that is, before the opening force of the springs was applied without opposition to the armature). When the air gap 34 opens due to the springs 33, 128 forcing the armature 24 open, the phase angle delays shorten, and the appropriate status signal is generated by the microprocessor. TABLE II shows exemplary phase angles which occur during opening verification.

TABLE II

| Phase Angle Delays: Opening Verification | | |
|---|---|---|
| VOLTAGE | CLOSED | OPEN |
| 130 | 251 | 21A |
| 120 | 246 | 1F5 |
| 110 | 221 | 1E8 |
| 100 | 211 | 1C1 |
| 90 | 1E8 | 194 |
| 80 | 1BA | 162 |
| 70 | 18B | 132 |
| 60 | 137 | F4 |
| 50 | 108 | AA |

This technique also identifies instances of sudden opening. Although infrequent, sudden opening may occur in the event of a large mechanical shock or a large fault current. In such a case it is appropriate to obtain a status indication of the open/closed condition of the contactor in order to enable the control system as a whole to respond appropriately, whereas lack of such information may result in the contactor circuits assuming anomalous states. Sudden opening is detected by keeping a running record of the phase angle delay and the voltage, and comparing the phase angle and voltage during each half cycle to the recorded data. A sudden opening results in a sudden decrease in phase angle which is not accompanied by a corresponding dip in voltage, and can be identified by the microprocessor, which then outputs a suitable status signal. It may be appropriate to require sudden opening detection over two or several half cycles before outputting the status signal, to reduce the possibility of erroneous operation as a result of line noise.

The invention does not require the addition of hardware to a contactor circuit because the information needed to verify closing and opening is available from the voltage and current sensing means, and the timing capability of the contactor circuit and the microprocessor included therein. The controller nevertheless responds very directly to the physical status of the contactor as provided by the existence or non-existence of an air gap between the armature and coil magnet. A complete interlock is provided, allowing for closing verification, opening verification, and detection of a sudden opening. No external electrical interlocks are required for providing status indications whereby contactors can be operated, coordinated, and included in larger control systems which rely on the status verification signals.

Exemplary embodiments of the invention having been disclosed, variations in keeping with the invention will also be apparent to persons skilled in the art. Whereas the invention is not limited to the foregoing examples, reference should be made to the appended claims to assess the scope of the invention in which exclusive rights are claimed.

We claim:

1. An electromagnetic arrangement, comprising:

an electromagnetic coil and an armature movable relative to the coil upon application of a driving current to the coil from an AC voltage source, the electromagnetic and the armature defining a magnetic circuit having a variable air gap;

means for determining a phase of said AC voltage and for repetitively switching the AC voltage across the coil during portions of half cycles thereof, for controlling coupling of power from the AC voltage source to the coil;

sensing means operable to monitor current in the coil at a predetermined point in the phase of the AC voltage; and, a control circuit including a microprocessor, coupled to the sensing means, the control circuit being operable to vary a length of said portions of half cycles for controlling variations in force applied between the coil and the armature, and to detect a change in inductance of the magnetic circuit due to enlargement and reduction of the air gap from sensed variation in length of said portions as said control circuit varies said length to keep said driving current generally constant at said predetermined point in the phase of the AC voltage.

2. The electromagnetic arrangement according to claim 1, wherein the air gap is reduced substantially to zero in a retracted position of the armature, wherein the control circuit is coupled to the sensing means in a feedback loop, the control circuit varying the voltage signal to maintain said predetermined driving current for at least one operation including acceleration, coasting, holding and release of the armature relative to the coil.

3. The electromagnetic arrangement according to claim 1, further comprising a first contact means and a second contact means mounted relative to the electromagnet and the armature, respectively, said first and second contact means engaging to achieve continuity in an electrical circuit substantially with collapse of the air gap to zero.

4. The electromagnetic arrangement according to claim 3, further comprising at least one spring biased in the retracted position of the armature to open the air gap and separate the first and second contacts, and wherein the microprocessor is operable to vary the predetermined driving current applied to the coil for exerting different degrees of force on the armature during at least two activities including accelerating the armature toward the coil, coasting the armature, holding the armature against a force of the at least one spring and releasing the armature for allowing the at least one spring to move the armature.

5. The electromagnetic arrangement according to claim 4, wherein the microprocessor is operable during at least one of said activities to switch the AC voltage for obtaining a test level of driving current, thereby measuring an inductance of the magnetic circuit.

6. The electromagnetic arrangement according to claim 5, wherein the microprocessor is operable to measure said inductance at least during coasting of the armature toward a position in which the first and second contacts engage, and following release of the armature for movement by the at least one spring.

7. The electromagnetic arrangement according to claim 6, wherein the test level is substantially equal to a driving current sufficient to hold the armature against the force of the at least one spring when the air gap is closed.

8. The electromagnetic arrangement according to claim 3, wherein the AC voltage is at least partly derived from the electrical circuit, such that loading of the electrical circuit results in variations in a level of the alternating current voltage signal, and wherein the microprocessor is responsive to variations in said level of the AC voltage.

9. An electrical contactor comprising:

a first contact means and a second contact means movably mounted to engage the first contact means for achieving continuity in an electrical circuit, at least one of the first and second contact means being movable relative to the other by an electromagnet and an armature defining a magnetic circuit with an air gap that closes in a first position of the contactor and opens in a second position of the contactor, the electromagnet and the armature being spring biased toward the second position, and opening and closing of the air gap affecting an inductance of the magnetic circuit;

a controller coupled to the electromagnet, the controller being operable to switch an alternating current driving voltage across the electromagnet during timed intervals of alternating current half cycles to maintain a predetermined driving current in the electromagnet;

current sensing means coupled to the controller and operable to sense a current in the electromagnet at a preset time during the half cycles, the controller being operable to detect opening and closing of the air gap by monitoring variation of said alternating current driving voltage required to maintain said predetermined driving current, during change in the inductance of the magnetic circuit with opening and closing of the air gap;

wherein the controller comprises timing means and a microprocessor operable to vary a duration of the driving voltage during the half cycles and to record numerically a previous cycle delay used for switching the driving voltage, the microprocessor adjusting a present cycle delay and the duration of the driving voltage for operating the contactor in a closing mode including acceleration to close the air gap, an opening mode for spring biased movement toward the second position, and a test level mode monitoring inductance of the magnetic circuit.

10. The electrical contactor according to claim 9, wherein the armature and the electromagnet are biased toward the second position by at least one kickout spring operable to separate the first and second contact means, and wherein the microprocessor is operable to switch the driving voltage to the electromagnet at a test level during a least one of coasting of the armature toward a position in which the first and second contact means engage, and following release of the armature for movement by the at least one kickout spring.

11. The electrical contactor according to claim 10, wherein the test level is substantially equal to a driving current sufficient to hold the armature against the force of the at least one kickout spring when the air gap is closed.

12. The electrical contactor according to claim 9, further comprising means coupled to the microprocessor for sampling a voltage across the electromagnet, and wherein the microprocessor is responsive to differences in the driving voltage.

13. The electrical contactor according to claim 9, wherein the microprocessor includes at least one of a data input and a data output, and wherein the microprocessor is operable for one of communicating a change in status of the air gap over said data output and responding to a signal on said data input.

* * * * *